United States Patent [19]

Kusuhara et al.

[11] Patent Number: 4,597,819
[45] Date of Patent: Jul. 1, 1986

[54] APPARATUS FOR ALTERING PITCH IN ARRANGEMENT OF WAFERS

[75] Inventors: Rei Kusuhara; Koichi Otsubo; Yasuo Yatabe, all of Tokyo, Japan

[73] Assignee: Tomco Mfg., Ltd., Tokyo, Japan

[21] Appl. No.: 683,305

[22] Filed: Dec. 18, 1984

[30] Foreign Application Priority Data

Feb. 29, 1984 [JP] Japan ............................ 59-38438

[51] Int. Cl.⁴ .................... C23F 1/02; H01L 21/00
[52] U.S. Cl. ........................... 156/345; 29/569 R;
29/759; 74/57; 74/59; 118/500; 118/728;
269/43; 294/87.1; 414/331
[58] Field of Search ............. 29/759, 569; 74/57-59;
118/500, 728; 156/345; 198/458; 269/43, 903;
294/87.1; 414/331; 432/253, 258, 259

[56] References Cited

U.S. PATENT DOCUMENTS

| | | | |
|---|---|---|---|
| 2,723,749 | 11/1955 | Peabody | 74/58 X |
| 2,849,710 | 8/1958 | Wade | 74/57 X |
| 3,062,529 | 11/1962 | Hiller | 269/43 X |
| 3,302,967 | 2/1967 | Harris et al. | 294/87.1 X |
| 3,446,161 | 5/1969 | Oddy | 198/458 X |
| 3,661,019 | 5/1972 | Kacalek et al. | 74/58 |
| 3,767,027 | 10/1973 | Pund et al. | 198/458 X |
| 3,860,280 | 1/1975 | Karlsson | 294/87.1 |
| 3,977,566 | 8/1976 | Hill et al. | 414/331 X |

FOREIGN PATENT DOCUMENTS

| | | | |
|---|---|---|---|
| 610868 | 10/1960 | Italy | 74/89.17 |
| 52-43373 | 4/1977 | Japan | 118/728 |
| 54-34774 | 3/1979 | Japan | 118/500 |
| 56-161653 | 12/1981 | Japan | 29/569 R |
| 57-201043 | 12/1982 | Japan | 29/569 R |

Primary Examiner—Lawrence J. Staab
Attorney, Agent, or Firm—Pollock, Vande Sande and Priddy

[57] ABSTRACT

A wafer arrangement pitch altering apparatus comprising a pair of cylindrical grooved cams parallelly disposed, a plurality of cylindrical grooves formed to intersect a given generatrix of the grooved cams with respectively equal pitches, disposed symmetrically each other around the peripheral surfaces of the cylindrical grooved cams, and intersections of the generatrix and the cylindrical grooved cams are moved at mutually dissimilar desired proportions along the axes of the cylindrical grooved cams in consequence of its rotation, plural pairs of moving elements disposed between the cylindrical grooved cams facing each other and provided with pins fitting into the cylindrical grooves on the corresponding cylindrical grooved cams, a pair of means for retaining the moving elements in a manner movable only in the axial direction of the cylindrical grooved cams, a cylindrical grooved cam driving element for rotating the cylindrical grooved cams by a prescribed angle in the mutually opposite directions, main grooves formed on the opposed surfaces of the moving elements and provided in the lower portions thereof with steplike parts adapted to receive wafers, a pair of support frames for severally holding in place the pairs of cylindrical grooved cams and retaining means, and a support frame moving element for altering the relative distance of the pair of support frames.

3 Claims, 9 Drawing Figures

APPARATUS FOR ALTERING PITCH IN ARRANGEMENT OF WAFERS

BACKGROUND OF THE INVENTION

1. Field of the Invention:

This invention relates to an apparatus for altering the pitch in the arrangement of wafers, and more particularly to an apparatus for altering the pitch in the arrangement of wafers which fits the operation of an automatic wafer transferring machine design for enabling wafers kept at a fixed pitch within one carrier to be transferred into another carrier and kept at a pitch which is a desired multiple of the first pitch.

2. Description of the Prior Art:

It is universally known that, in the process for the production of semiconductors, semiconductor wafers undergo various heat treatments, chemical treatments, and washing treatments. In the performance of these treatments upon the wafers, it has been customary for these wafers to be collectively handled in bunches as contained severally in carriers with a view to improving the efficiency of the treatments.

The carriers mentioned above are boxes which have grooves formed therein as spaced with a fixed pitch for keeping wafers neatly arranged therein. Of course, the efficiency of the treatments improves in proportion as the number of wafers contained in these carriers increases.

Depending on the nature of a treatment to be performed—depending on the choice between a heat treatment and an etching treatment, for example,—it becomes necessary to alter the pitch separating the individual wafers kept in the aforementioned carriers in order to derive a normal expected effect from the treatment.

The heat treatment, for example, is performed on the wafers separated with a very small pitch to ensure high efficiency of the treatment. In contrast, the CVD (chemical vapor deposition) treatment or the etching treatment is performed on the wafers separated widely as compared with the heat treatment, for the purpose of precluding possible unevenness of the effect of treatment.

Further depending on the difference in the nature of treatment mentioned above, the material of the carriers must be changed. For example, the heat treatment is performed on the wafers as contained in carriers made of quartz or the like, while the etching treatment is performed on the same wafers as contained in resinous carriers made of fluorocarbon polymers (Teflon) or the like.

When these wafers are transferred from one treatment to a subsequent treatment, therefore, it is necessary to perform an operation of causing the wafers disposed in the grooves separated with a certain pitch within a carrier made of a certain substance to be transferred into another carrier made of a different substance and set in place in the grooves separated with a different pitch.

Heretofore, this operation has been performed one by one either by a machine adapted to handle the wafers or directly by human hands with the aid of vacuum pincers.

Where the wafers are separated by one fixed pitch throughout all the treatments and their carriers are made of materials different from one treatment to another, it has been customary for the wafers to be transferred from a first carrier to a second carrier by first posing the first carrier so that the wafers are held therein in the horizontal direction, placing the second carrier in intimate contact with the first carrier in such a manner that their faces for entry of wafers will confront each other, and turning the joined carriers thereby causing the second carrier to underlie the first carrier and enabling the wafers to fall from the first carrier into the second carriers. Again in this case, the operation of transfer is effected by these carriers being handled in human hands.

The conventional practice, however, has entailed a disadvantage that during the transfer of the wafers from the first to the second carriers, the wafers are soiled or they are scratched or even broken owing to collision with the first and second carriers or they are injured as when they fall onto hard objects such as the floor surface.

Particularly in the case of the operation of bringing the first and second carriers into intimate mutual contact of their faces for entry of wafers, the wafers are liable to sustain scratches and chippings and to be contaminated with pulverized dust.

Moreover, the conventional practice has entailed a disadvantage that since there are steps in which the wafers have to be transferred one by one and handled directly by human hands, the transfer consumes much time and the efficiency of the work is poor and, as the result, the cost of semiconductor production is high.

SUMMARY OF THE INVENTION

This invention has been produced for the purpose of overcoming the drawbacks mentioned above. An object of this invention is to provide an apparatus for altering a pitch in the arrangement of wafers so as to serve for an automatic wafer transferring machine which enables the wafers kept at a fixed pitch within a first carrier to be transferred into a second carrier and disposed therein at a pitch which is a desired multiple of the aforementioned fixed pitch.

To attain the object described above, this invention provides an apparatus comprising a pair of cylindrical grooved cams disposed parallelly to each other, a plurality of cylindrical grooves formed to intersect given generatrix of the aforementioned pair of cylindrical grooved cams with respectively equal pitches, disposed symmetrically relative to each other around the peripheral surfaces of the cylindrical grooved cams, and intersections of the generatrix and the cylindrical grooved cams are moved at mutually dissimilar desired proportions along the axes of the cylindrical grooved cams in consequence of the rotation thereof, a plurality of pairs of moving elements disposed as opposed to each other between the aforementioned pair of cylindrical grooved cams and provided with pins fitting into the cylindrical grooves on the corresponding cylindrical grooved cams, a pair of means for retaining the aforementioned moving elements in a manner movable only in the axial direction of the aforementioned pair of cylindrical grooved cams, a cylindrical grooved cam driving element for rotating the aforementioned pair of cylindrical grooved cams by a prescribed angle in the mutually opposite directions, main grooves formed on the opposed surfaces of the aforementioned moving elements and provided in the lower portions thereof with steplike parts adapted to receive wafers into fast engagement, a pair of support frames for severally holding in place the aforementioned pair of cylindrical grooved cams and the aforementioned pair of retaining means, and a support frame moving element for altering the relative distance of the aforementioned pair of support frames.

BRIEF DESCRIPTION OF THE DRAWINGS

FIG. 4 (a) is a front view of a table, a first and a second carrier, and FIG. 4 (b) is a detailed plan view of FIG. 4 (a).

FIGS. 5 (a)-5 (d) are a series of explanatory diagrams illustrating the procedure for transfer of wafers.

DETAILED DESCRIPTION OF THE PREFERRED EMBODIMENT

Now, the present invention will be described in detail below with reference to the accompanying drawings.

Figure 1:
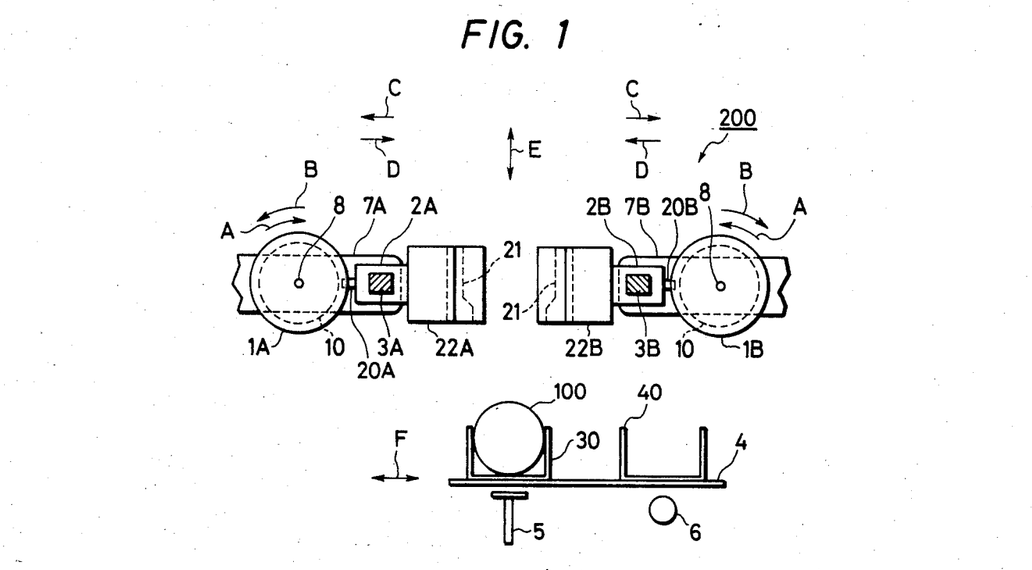
FIG. 1 is a schematic front view of an automatic wafer transferring machine adopting one embodiment of this invention.

FIG. 1 is a schematic front view of an automatic wafer transferring machine adopting one embodiment of the present invention. In FIG. 1, a wafer arrangement pitch altering apparatus 200 as one embodiment of this invention comprises left and right cylindrical grooved cams 1A, 1B, cylindrical grooves 10, left and right moving elements 2A, 2B, pins 20A, 20B, wafer engaging pieces 22A, 22B, slide shafts 3A, 3B, and left and right support frames 7A, 7B.

The left cylindrical grooved cam 1A and the right cylindrical grooved cam 1B are cylindrical and are disposed parallelly to each other. From the centers of the opposite ends of these left and right cylindrical grooved cams 1A, 1B, shafts 8 are projected. On the outer circumferential surfaces of these cams, a plurality of cylindrical grooves having dissimilar lead angles are formed as described afterward.

The shafts 8 projected from the opposite ends of the aforementioned left cylindrical grooved cam 1A are rotatably inserted in the holes formed in the left support frame 7A. Similarly, the shafts 8 projected from the opposite ends of the aforementioned right cylindrical grooved cam 1B are rotatably inserted in the holes formed in the right support frame 7B.

The aforementioned shafts 8 are further connected to a cylindrical grooved cam driving element which is not shown in the diagram. By the operation of the cylindrical grooved cam driving element, the aforementioned left and right cylindrical grooved cams 1A, 1B are enabled to rotate in mutually opposite directions, namely in the directions of the arrow A or those of the arrow B, and by a desired and same angle.

On the aforementioned left and right support frames 7A, 7B, the slide shafts 3A, 3B each having a rectangular cross section are fixed as laid parallelly to the aforementioned left and right cylindrical grooved cams 1A, 1B. These slide shafts 3A, 3B pierce the holes slightly larger than the cross sections of the aforementioned slide shafts 3A, 3B which are formed in the left moving element 2A and the right moving element 2B.

The aforementioned slide shafts 3A, 3B are intended to inhibit the left and right moving elements 2A, 2B from being rotated. If such slide shafts can be disposed two each on the aforementioned left and right support frames 7A, 7B, they may be cylindrical instead of being angular. They may be replaced by some other suitable means capable of fulfilling the same function.

The numbers of the left and right moving elements 2A, 2B are equal to those of the cylindrical grooves 10 formed on the aforementioned left and right cylindrical groove cams 1A, 1B. These moving elements are meshed with the aforementioned cylindrical grooves 10 through the medium of the pins 20A, 20B projected from the left and right moving elements 2A, 2B.

To the opposed parts of the left and right moving elements 2A, 2B are fastened the wafer engaging pieces 22A, 22B provided with main grooves 21 adapted to receive wafers into fast engagement therewith as described fully afterward.

The aforementioned left and right support frames 7A, 7B are connected to the support frame moving element not shown in the drawing, so that these left and right support frames 7A, 7B will be moved away from each other (in the directions of the arrow C) or moved toward each other (in the directions of the arrow D). Further, they can be moved in either way vertically (in the directions of the arrow E) relative to the table 4 disposed thereunder.

A first carrier 30 and a second carrier 40 are placed on the aforementioned table 4. This table 4 is connected to a table moving element (not shown) so as to be reciprocated (in the directions of the arrow F).

A pusher 5 is disposed below the aforementioned table 4. This pusher 5 is connected to a pusher elevating element (not shown) so as to be reciprocated in the vertical direction. Said pusher 5 is also allowed to enter the interiors of the aforementioned first and second carriers 30, 40 through the pusher holes formed in the bottom sides of the first and second carriers 30, 40 as well as in the aforementioned table 4.

Below the table 4 is disposed a cylindrical roller 6. This roller is connected to a roller driving element (not shown) so as to be rotated about its axis and reciprocated in the vertical direction.

Figure 2:
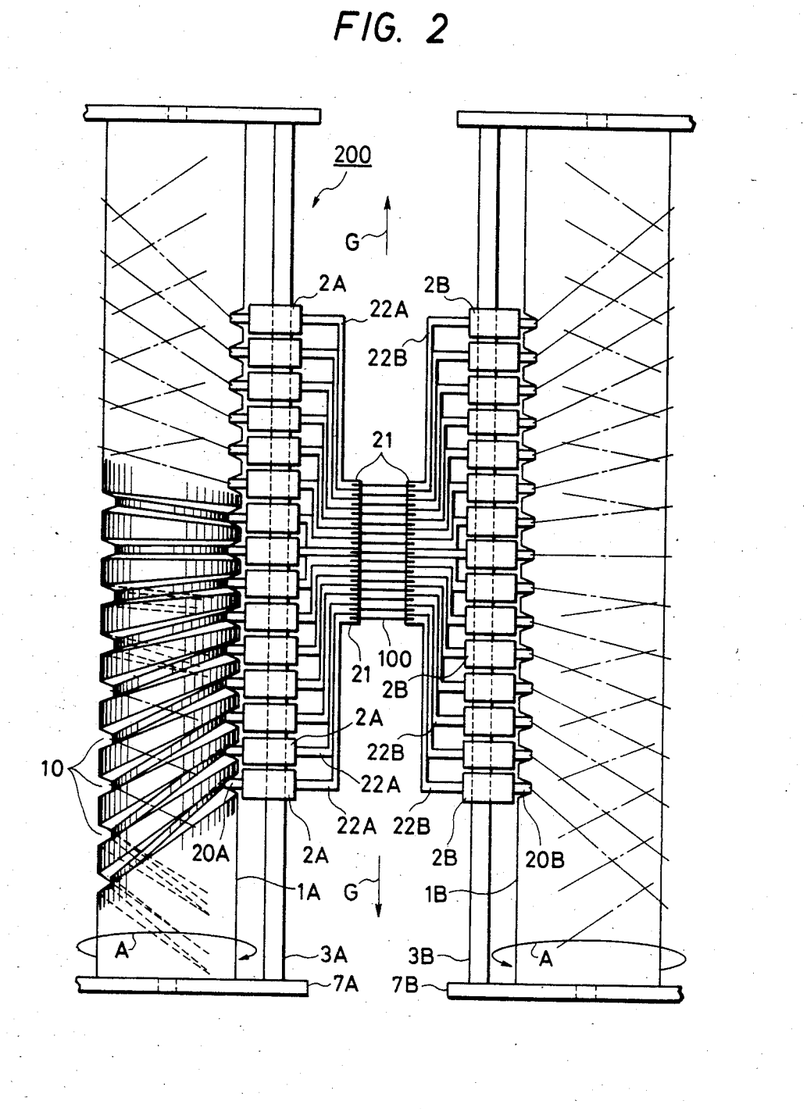
FIG. 2 is a schematic plan view of an apparatus for altering a pitch in the arrangement of wafers as adopted in the setup of FIG. 1.

FIG. 2 is a schematic plan view of the pitch altering apparatus 200 in the setup of FIG. 1.

In this diagram, the same symbols as found in FIG. 1 denote identical or equal component parts. To facilitate the comprehension of the drawing, the cylindrical grooves 10 are shown only in about one half portion of the left cylindrical grooved cam 1A. The remainders thereof are shown by chain lines in a simplified pattern.

With reference to FIG. 2, a total of 15 cylindrical grooves 10 are formed on each of the left cylindrical grooved cam 1A and the right cylindrical grooved cam 1B. This invention has no reason to limit the number of these cylindrical grooves 10 particularly to 15. The number may be larger or smaller. It should be noted, however, that the number of the wafers which the pitch altering apparatus 200 is allowed to transfer in one bunch is decided by the number of these cylindrical grooves 10.

The cylindrical grooves 10 formed on the left cylindrical grooved cam 1A and the cylindrical grooves 10 formed on the right cylindrical grooved cam 1B are symmetrical to each other.

As evident from the drawing, each of the cylindrical grooves 10 is formed on the left cylindrical grooved cam 1A in such a manner as to describe on the outer circumferential surface thereof an ordinary helix, namely a locus at all the points on which the ratio of the distance of motion in the direction of the axis of the left cylindrical grooved cam 1A to the angle of rotation of that motion around the aforementioned axis is constant. The ratio mentioned above, however, is adapted so as to vary at a prescribed proportion along the sequence in which the individual cylindrical grooves 10 are arranged.

To be more specific, the angle formed between the plane perpendicular to the axis of the aforementioned left cylindrical grooved cam 1A and the aforementioned ordinary helix (lead angle) is adapted to vary at a respectively fixed proportion from one to another of the 15 cylindrical grooves 10 in the sequence of their arrangement. When the left cylindrical grooved cam 1A is rotated by a given angle, therefore, the intervals separating the left moving elements 2A are changed and the new intervals are equal to one another at all times.

It is plain from the foregoing description that the aforementioned cylindrical grooves 10 can be formed within the range of 360° around the axis of the aforementioned left cylindrical grooved cam 1A. In FIG. 2, these cylindrical grooves 10 are portrayed as formed in angles approximating 360°.

Let the term "lead" define the distance advanced in the direction of the axis of the aforementioned cam 1A in consequence of one complete rotation along the ordinary helix of the aforementioned cylindrical groove 10 around the axis of the cylindrical grooved cam 1A, and this "lead" will vary from one after another of the cylindrical grooves 10 because the aforementioned lead angles for the individual cylindrical grooves 10 are dissimilar.

With reference to FIG. 2, in the 15 cylindrical grooves formed on each of the left and right cylindrical grooved cams 1A, 1B, the cylindrical groove 10 at the center has no "lead" and the cylindrical grooves 10 formed on both sides of the central cylindrical groove 10 have gradually increasing "lead" in proportion to their approximation to the opposite ends of the left and right cylindrical grooved cams 1A, 1B.

When the left and right cylindrical cams 1A, 1B are rotated in the directions of the arrow A, therefore, 15 left and 15 right moving elements 2A, 2B provided severally with pins 20A, 20B fitted into the cylindrical grooves 10 are dispersed from the centrally located left and right moving elements 2A, 2B in the directions of the arrows G, in such a manner as to widen their intervals.

To the mutually opposed portions of the left and right moving elements 2A, 2B, the wafer engaging pieces 22A, 22B severally provided with main grooves 21 for receiving wafers 100 into fast engagement therewith are attached fast as described above. The reason for the provision of such main grooves 21 is as follows.

As universally known, the wafers 100 are thin disks. When a plurality of such wafers are collectively treated, the pitch with which the individual wafers 100 are arranged as separated is about 1 mm at least.

Incidentally, the left and right cylindrical grooved cams 1A, 1B and the left and right moving elements 2A, 2B cannot be manufactured in amply reduced dimensions because they are required to possess fairly high degrees of precision.

Thus, by attaching the wafer engaging pieces 22A, 22B, a few formed straightly and the majority variously bent after the pattern of a crank as illustrated in FIG. 2, fast to the aforementioned left and right moving elements 2A, 2B, the pitch with which the individual wafers 100 are arranged as spaced is allowed to be made small.

Of course, these wafer engaging pieces 22A, 22B will be found useless and may be omitted where the left and right cylindrical grooved cams 1A, 1B and the left and right moving elements 2A, 2B can be manufactured in amply reduced dimensions or where the minimum pitch of the wafers 100 is not required to be decreased any further. When the wafer engaging pieces 2A, 2B are eliminated as described above, the main grooves 21 serving to receive the wafers 100 into fast engagement may be formed directly in the mutually opposed portions of the left and right moving elements 2A, 2B.

In FIG. 2, the cylindrical grooves 10 are depicted as possessing a trapezoidal cross section. This is not the only cross section that is permitted for the grooves. These grooves may be formed in any desired cross section.

Figure 3:
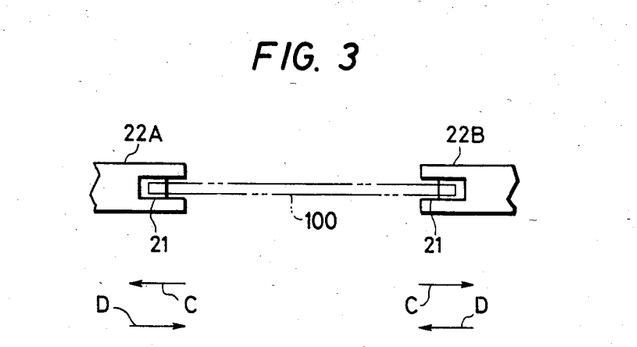
FIG. 3 is a magnified view of main grooves formed in wafer engaging pieces in the apparatus of FIG. 2.

FIG. 3 is a magnified view of the main grooves 21 formed in one pair of wafer engaging pieces 22A, 22B found in FIG. 2.

In this diagram, the same symbols as found in FIG. 2 denote identical or equivalent component parts. The diagram illustrates only the portions of the wafer engaging pieces 22A, 22B which embrace the main grooves 21 and omits the remaining portions.

In the opposed portions of the wafer engaging pieces 22A, 22B, the main grooves 21 with a rectangular cross section are formed one each. The main grooves 21 are provided in the lower portions of the wafer engaging pieces 22A, 22B with stepped parts intended to decrease the depth of the grooves (FIG. 1). The main grooves 21 are formed in a width slightly larger than the width of the wafers 100.

By moving the wafer engaging pieces 22A, 22B away from each other in the directions of the arrows C or toward each other in the directions of the arrows D, therefore, the paired main grooves 21 are separated enough to permit passage of a wafer 100 or drawn together enough for the wafer 100 to be caught fast by the stepped parts of the main grooves 21.

Figure 4A:
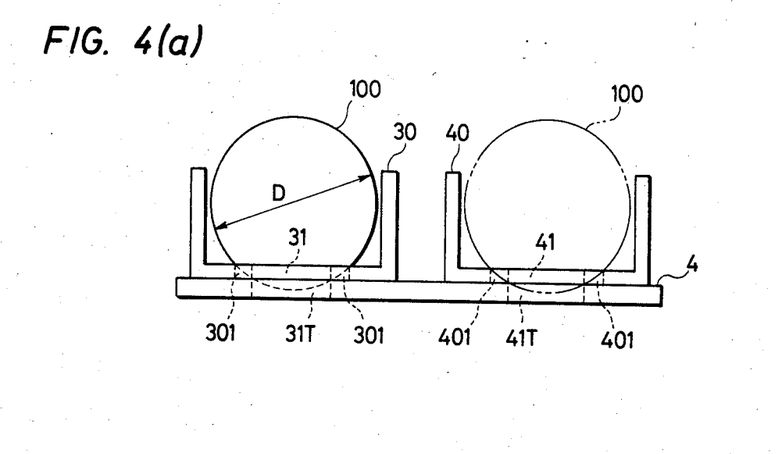
Figure 4B:
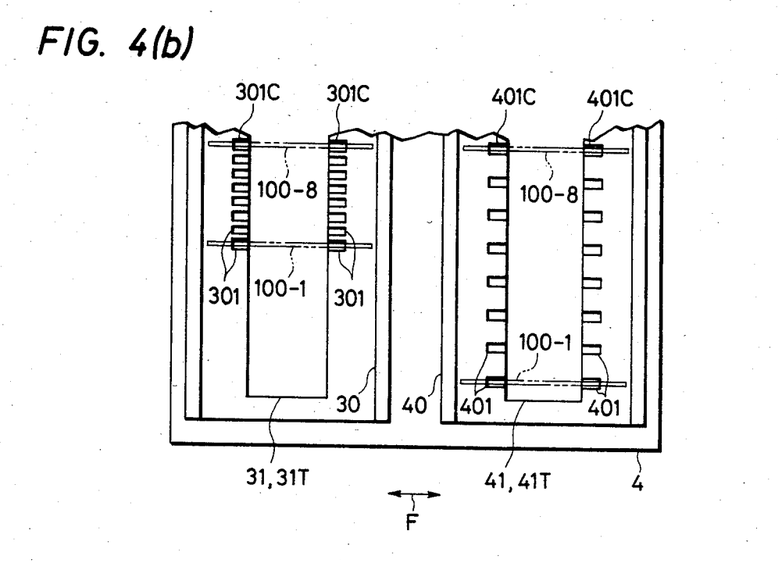

FIG. 4 (a) is a front view of the table 4 and the first and second carriers 30, 40 in the apparatus of FIG. 1, and FIG. 4 (b) is a plan view of FIG. 4 (a).

In these diagrams, the same symbols as found in FIG. 1 denote identical or equivalent component parts.

With reference to FIG. 4 (a) and (b), the first and second carriers 30, 40 have a concaved cross section. To admit wafers in these concaved interiors, the opposed inner surfaces of their lateral walls are separated by a distance larger than the outside diameter D of the wafers 100.

The first and second carriers 30, 40 are provided in their bottom walls respectively with a first pusher hole 31 and a second pusher hole 41, both in a rectangular shape.

Along the opposed edges of the first and second pusher holes 31, 41 lying parallelly to the lateral walls of the first and second carriers 30, 40, a row of first wafer engaging grooves 301 and a row of second wafer engaging grooves 401 are respectively formed.

The first and second wafer engaging grooves 301, 401 formed along the opposed edges of the aforementioned first and second pusher holes 31, 41 are as many as the numbers of wafers 100 to be accommodated in the aforementioned first and second carriers 30, 40.

When the number of the cylindrical grooves 10 formed each on the left and right cylindrical grooved cams 1A, 1B is 15 as described above, then the numbers of the first and second wafer engaging grooves 301, 401 are 15 each.

As illustrated in FIG. 4 (b), the first wafer engaging grooves 301 are spaced with a pitch smaller than the pitch with which the second wafer engaging grooves 401 are spaced. The pitches mentioned above are freely selected to suit the particular types of treatments to be performed on the wafer 100. Naturally, they are selected within the range in which the pitch of the main grooves 21 is variable with the rotation of the left and right cylindrical grooved cams 1A, 1B.

It is now assumed that the numbers of the first and second wafer engaging grooves 301, 401 to be formed along the opposed edges of the first and second pusher holes 31, 41 are 15 each. In FIG. 4, the wafer engaging grooves located at the center, namely the first and second wafer engaging grooves 301C, 401C which are to receive the 8th wafer 100-8 as reckoned starting from the wafer 100-1 to be received in the lowest or bottom grooves in FIG. 4 (b), are formed on one straight line at the centers respectively of the first and second carriers 30, 40.

This is because these central wafer engaging grooves are required to correspond to the central cylindrical grooves 10 which are formed on the left and right cylindrical grooved cams 1A, 1B as shown in FIG. 2 so as to have zero "lead".

The main grooves 21 located at the center do not change their positions at all when all the main grooves 21 are dispersed with an increased pitch by rotating the left and right cylindrical grooved cams 1A, 1B by a desired angle. By simply moving the table 4 in the directions of the arrows F, therefore, the main grooves 21 can be brought to positions directly above the second wafer engaging grooves 401C or the first wafer engaging grooves 301C.

When the table 4 is constructed so that it will be moved perpendicularly to the plane of the sheet of FIG. 1, therefore, the first wafer engaging groove 301C and the second wafer engaging groove 401C formed respectively at the centers are not required to fall on one straight line and to be formed at the centers of the first and second carriers 30, 40.

The aforementioned first and second wafer engaging grooves 301, 401 are intended to admit wafers and keep them from inclining. Thus, their dimensions and shape must be deliberately selected to suit the dimensions of wafers 100.

The aforementioned first and second carriers 30, 40 are attached fast to the top of the table 4. In this table 4, therefore, pusher holes 31T, 41T identical in shape to the first and second pusher holes 31, 41 formed in the first and second carriers 30, 40 are formed.

The first and second carriers 30, 40 are attached to the table 4 in such a manner that the aforementioned first and second pusher holes 31, 41 will coincide with the pusher holes 31T, 41T.

Now, the procedure followed in the transfer of wafers by the automatic wafer transfering machine illustrated in FIG. 1 will be described below.

FIG. 1 depicts the initial condition of wafer transfer.

In the first wafer engaging grooves 301 formed in the first carrier 30, 15 wafers 100 are kept in engagement.

The pitch of the main grooves 21 formed severally in the 15 pairs of wafer engaging pieces 22A, 22B is so fixed that it will be equalized to the pitch of the wafers 100 kept in engagement in the first carrier 30 by rotating the left and right cylindrical grooved cams 1A, 1B.

The positions of the left and right support frames 7A, 7B are so selected that the wafers 100 will be allowed to pass between the main grooves 21 formed in the aforementioned wafer engaging pieces 22A and 22B.

FIG. 5 (a) through FIG. 5 (d) are a series of explanatory diagrams showing the sequence of the wafer transfer. In these diagrams, the same symbols as found in FIG. 1 denote identical or equivalent component parts.

First with reference to FIG. 5 (a), the left and right support frames 7A, 7B are lowered in the direction of the arrow E2 by the support frame moving element (not shown) and then are brought to a stop when the wafer engaging pieces 22A, 22B approach the lateral walls of the first carrier 30.

Figure 5A:
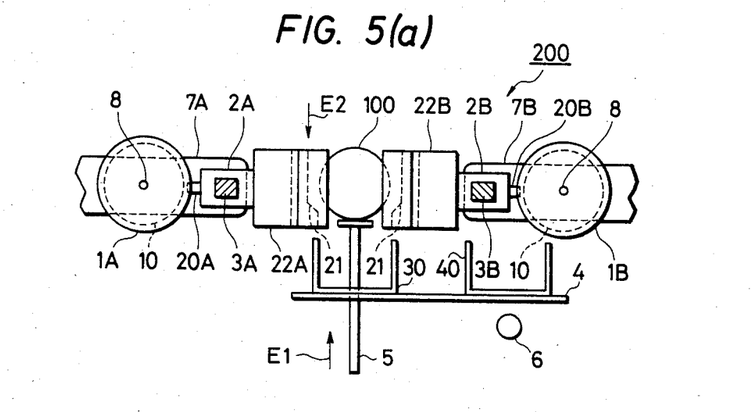

The pusher 5 disposed below the first carrier 30 is elevated in the direction of the arrow E1 by a pusher elevating element (not shown). This pusher 5 comes into contact with the lower portions of the peripheries of the 15 wafers 100 and elevates the wafers 100.

The pusher 5 comes to a stop at the time that the wafers 100 which have entered the interiors of the main grooves 21 formed in the aforementioned wafer engaging pieces 22A, 22B reach the upper parts of the stepped parts in the main grooves 21 as illustrated in FIG. 5 (a).

In the next step shown in FIG. 5 (b), the aforementioned left and right support frames 7A, 7B are moved toward each other in the directions of the arrows D. This motion is continued until the distance between the opposed portions of the lower parts of the steps of the main grooves 21 becomes smaller than the diameter of the wafers 100.

Figure 5B:
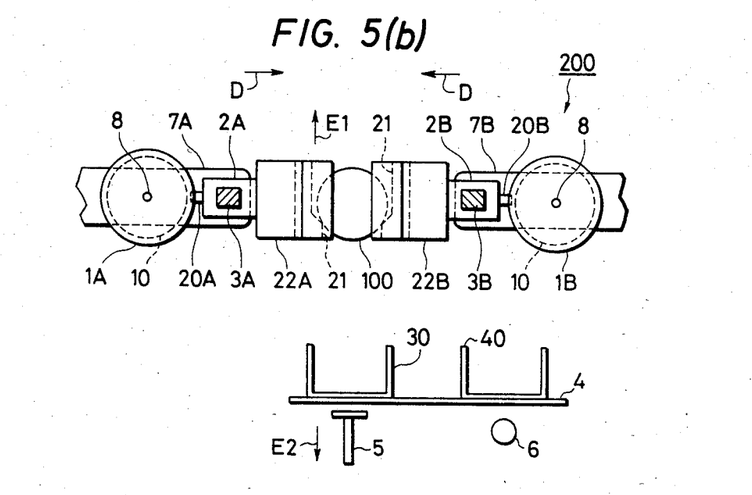

When the motion of the left and right support frames 7A, 7B in the directions of the arrows D is completed, the pusher 5 is lowered in the direction of the arrow E2. Then, the aforementioned left and right support frames 7A, 7B are elevated in the direction of the arrow E1.

As the result, the wafers 100 are set in engagement with the main grooves 21.

Now in the step of FIG. 5 (c), the table 4 is moved in the direction of the arrow F1 by a table moving element (not shown). This motion is continued until the second carrier 40 disposed on the table 4 reaches its position directly below the wafers 100 kept in engagement with the wafer engaging pieces 22A, 22B.

Figure 5C:
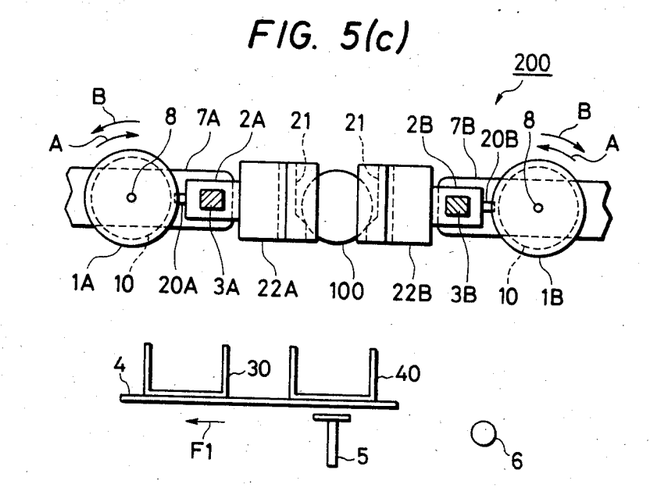

Subsequently, the left and right cylindrical grooved cams 1A, 1B are rotated in the directions of the arrows A by the cylindrical grooved cam driving element (not shown). This rotation is continued until the pitch of the wafers 100 kept in engagement with the wafer engaging pieces 22A, 22B is equalized with the pitch of the 15 pairs of second wafer engaging grooves 401 formed in the second carrier 40.

According to the description made above with reference to FIG. 4, the pitch of the second wafer engaging grooves 401 formed in the second carrier 40 is larger than the pitch of the first wafer engaging grooves 301 formed in the first carrier 30. Optionally, this relation between the two pitches may be reversed. In that case, the left and right cylindrical grooved cams 1A, 1B have to be rotated in the directions of the arrows B.

In the step of FIG. 5 (d), the left and right support frames 7A, 7B are lowered in the direction of the arrow E2 by the operation of the support frame moving element (not shown) and brought to a stop when the wafer engaging pieces 22A, 22B approach the lateral wall of the second carrier 40.

Figure 5D:
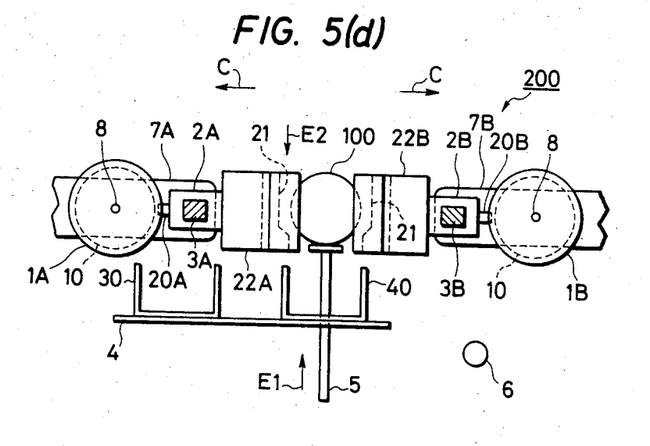

After the table 4 has been moved to the left as mentioned above, the pusher 5 is brought to its position below the second carrier 40. And it is elevated by the pusher elevating element (not shown).

The ascending pusher 5 rises past the second pusher hole 41 formed in the bottom wall of the second carrier 40 and the pusher hole 41T formed in the aforementioned table 4 and comes into contact with the lower portions of the peripheries of the 15 wafers 100 kept in engagement with the main grooves 21 formed in the wafer engaging pieces 22A, 22B.

The pusher 5 continues its ascent to raise the aforementioned wafers 100 slightly above the stepped parts of the main grooves 21 holding the wafers 100 in fast engagement therein. Then, the pusher 5 discontinues its ascent.

Subsequently, the left and right support frames 7A, 7B are moved in the directions of the arrows C by the operation of the support frame moving element (not shown). Conversely to the step of FIG. 5 (b), this motion is continued until the distance between the opposed portions of the lower parts of the steps of the aforementioned main grooves 21 becomes larger than the diameter of the wafers 100.

When the motion of the left and right support frames 7A, 7B in the directions of the arrows C is completed, the pusher 5 is lowered in the direction of the arrow E2. Then, the left and right support frames 7A, 7B are elevated in the direction of the arrow E1.

In consequence of the operation described above, the plurality of wafers 100 initially kept within the first carrier 30 have been transferred into the second carrier 40 and placed therein as spaced with an altered pitch.

The reverse of the operation consisting of the steps of FIG. 5 (a) through FIG. 5 (d), namely the transfer of the wafers contained in the second carrier 40 to the interior of the first carrier 30, can be easily attained by completely reversing the procedure described above.

In the embodiment described above, the first carrier 30 and the second carrier 40 are illustrated as disposed on the table 4. It is naturally permissible to dispose on the table one or more other similar carriers having wafer engaging grooves formed therein with pitches different from the pitches of the aforementioned first and second wafer engaging grooves 301, 401.

In the embodiment of this invention described above, for the purpose of transferring the wafers 100 kept in engagement with the first or second wafer engaging grooves 301, 401 formed in the first or second carriers 30, 40, the means of the main grooves 21 formed in the wafer engaging pieces 22A, 22B are adopted.

Since the first and second wafer engaging grooves 301, 401 and the main grooves 21 are intended to receive the wafers 100 into engagement or retention, they are not allowed to have amply large widths. They nevertheless are required to offer proper clearance.

Incidentally, the wafers 100 kept in engagement with the first or second wafer engaging grooves 301, 401 are not allowed to stand upright relative to the bottom face of the carrier because of the aforementioned clearance in the wafer engaging grooves.

As the result, the wafers are left standing with a small angle of inclination from the plane vertical to the bottom surface of the carrier, some tilting forward and others backward relative to the vertical plane.

In this condition, the upper portions of the wafers 100 held in the carrier are not spaced with a uniform pitch. Owing to the absence of the uniform pitch, smooth insertion of the wafers 100 into the main grooves 21 formed in the wafer engaging pieces 22A, 22B is obtained only with difficulty. In an extreme case, the aforementioned operation of wafer transfer may be obstructed or the wafers may be damaged.

As a solution to this problem, there may be conceived means of adapting the aforementioned table 4 to be inclined about a virtual axis parallel to the line of intersection between the top of the table 4 and the main surfaces of the wafers 100. By the inclination of the aforementioned table 4, all the wafers 100 are inclined toward one and the same direction. Consequently, the pitch of the wafers is uniformized for each carrier.

When the inclination is allowed to occur in a large angle, it becomes necessary to adjust the relative positions of the first and second wafer engaging grooves 301, 401 formed in the first and second carriers 30, 40 and the main grooves 21 formed in the wafer engaging pieces 22A, 22B.

As already described, the main grooves 21 in the wafer engaging pieces 22A, 22B are so formed as to offer proper clearance for the wafers 100 inserted therein.

This clearance is intended to enable the wafers 100 kept in engagement with the wafer engaging grooves and raised by the pusher 5 to be inserted into the main grooves 21 with ease.

This clearance, however, entails a possibility that the wafers 100 will not be retained parallelly to one another. In this condition, therefore, the wafers 100 retained by the wafer engaging pieces 22A, 22B will be inserted for engagement into the first or second wafer engaging grooves 301, 401 only with difficulty.

For the solution of this problem, the main grooves 21 are desired to be formed in a cross section resembling a trapezoid or a funnel and not a rectangle, so that the bottom faces of the grooves have the same width as the wafers 100 and the open tops of the grooves have a larger width than the bottom faces thereof.

When the main grooves 21 are formed in a cross section resembling a trapezoid or a funnel, the insertion into the main grooves 21 of the wafers 100 kept in engagement in the first or second wafer engaging grooves 301, 401 can be realized as easily as when the main grooves 21 are formed in a rectangular cross section large enough to offer ample clearance. During the retention of the wafers 100, no idle space is formed between the wafers 100 and the main grooves 21 because the wafers 100 are supported in place by the bottom surfaces of the main grooves.

In the embodiment described above, in the 15 cylindrical grooves 10 formed each in the left and right cylindrical grooved cams 1A, 1B, the particular cylindrical grooves 10 located at the centers have been described as having zero "lead". This choice of the central cylindrical grooves 10 is not critical. Any one pair of opposed cylindrical grooves 10 such as, for example, those located by the lateral side may be adapted to have zero "lead".

It is self-evident that the proportion in which the pitch of the wafers 100 is increased or decreased is heightened by allowing one set of cylindrical grooves 10 to possess zero "lead". However, the presence of this particular set of cylindrical grooves having zero "lead" is not always required.

It has been already pointed out that the cylindrical grooves 10 are each formed within the limit of 360°. So far as this limit is not surpassed, the lead angles of the individual cylindrical grooves are not always required to be constant. When the pitch of the wafers 100 is to be fixed at a very small value with very high accuracy, for example, the cylindrical grooves 10 may be so constructed that the portions of the cylindrical grooved cams 1A, 1B falling within a certain range of rotation will be given smaller lead angles and the remaining portions thereof will be given larger lead angles, that is, each of the cylindrical grooves will have at least two lead angles of dissimilar magnitudes.

Where the cylindrical grooves 10 are thus adapted each to possess a plurality of lead angles of dissimilar magnitudes, portions possessing zero "lead" may be formed in boundaries intervening between lead angles of dissimilar magnitudes.

The boundaries thus offering zero "lead" have absolutely no effect upon the alteration of the pitch of the wafers 100. Where the rotation of the left and right cylindrical grooved cams 1A, 1B is controlled with a micro-computer, the positions or rotation angles at which the lead angles change magnitude can be accurately detected by appropriate means capable of detecting the positions producing zero "lead". In this setup, the control of the pitch of the wafers 100 can be effected with enhanced accuracy.

One extension of the inventive idea of these cylindrical grooves 10 each having a plurality of lead angles of dissimilar magnitudes may lead to conception of cylindrical grooves 10 each possessing an infinite lead angle such that when the cylindrical grooves 10 are spread out on one plane, they will describe a smooth curve instead of a straight line or a combination of numerous segments of straight line.

The cylindrical grooves 10 of this invention may be realized in various forms. What is applicable invariably and is important is the fact that the cylindrical grooves 10 formed on the left cylindrical grooved cam 1A and the right cylindrical grooved cam 1B must be symmetrical with each other and, despite the positions of rotation of the left and right cylindrical grooved cams 1A, 1B, the left and right moving elements 2A, 2B must be disposed at all times with one equal pitch.

In the embodiment described above, the table 4 is moved in effecting the transfer of wafers 100. This transfer is naturally obtained by moving the left and right support frames 7A, 7B and the pusher 5 relateive to the aforementioned table 4.

It is clear from the foregoing description that the present invention brings about the following effect.

Since the disposition pitch of a plurality of wafers holded by means of the plurality of pairs of main grooves can be altered to any desired pitch, collective transfer of the plurality of wafers can be effected without suffering the wafers to be contaminated or to sustain injury. Thus, the transfer of wafers can be effected efficiently and quickly. This invention contributes to economization of the production of wafers.

What is claimed is:

1. An apparatus for altering a pitch in the arrangement of a plurality of wafers, comprising a pair of cylindrical grooved cams disposed parallelly to each other and provided each on the circumferential surface thereof with a plurality of cylindrical grooves, a plurality of pairs of moving elements disposed as opposed to each other between said pair of cylindrical grooved cams and provided severally with pins adapted to fit into said cylindrical grooves of said cylindrical grooved cams, a pair of means for retaining said moving elements in a state movable only in the direction of the axes of said pair of cylindrical grooved cams, a cylindrical grooved cam driving element for rotating said pair of cylindrical grooved cams in mutually opposite directions by equal angles, main grooves formed in the opposed faces of said moving elements and provided in the lower parts thereof with stepped parts for engagement with wafers, a pair of support frames for retaining said pair of cylindrical grooved cams and said pair of retaining means in prescribed relative positions, and a support frame moving element for changing the distance between said pair of support frames, wherein said cylindrical grooves are formed symmetrically with respect to each other on the circumferential surfaces of the respective cylindrical grooved cams in such a manner that the moving elements will be moved at desired dissimilar proportions in the direction of the axes of said cylindrical grooved cams in consequence of the rotation of said cylindrical grooved cams and will be always separated with equal pitch.

2. An apparatus according to claim 1, wherein said main grooves have a cross section resembling a trapezoid.

3. An apparatus for altering a pitch in the arrangement of a plurality of wafers, comprising a pair of cylindrical grooved cams disposed parallelly to each other and provided each on the circumferential surface thereof with a plurality of cylindrical grooves, a plurality of pairs of moving elements disposed as opposed to each other between said pair of cylindrical grooved cams and provided severally with pins adapted to fit into said cylindrical grooves of said cylindrical grooved cams, a pair of means for retaining said moving elements in a state movable only in the direction of the axes of said pair of cylindrical grooved cams, a cylindrical grooved cam driving element for rotating said pair of cylindrical grooved cams in mutually opposite directions by equal angles, a plurality of pairs of wafer engaging pieces attached fast to the opposed faces of said moving elements and formed in such a manner that the pitch of the opposed parts thereof will be smaller than the pitch of said moving elements, main grooves formed in the opposed faces of said wafer engaging pieces and provided in the lower portions thereof with stepped parts for engagement of wafers, a pair of support frames for retaining said pair of cylindrical grooved cams and said pair of retaining means in prescribed relative positions, and a support frame moving element for changing the distance between said pair of support frames, wherein said cylindrical grooves are formed symmetrically with respect to each other on the circumferential surfaces of the respective cylindrical grooved cams in such a manner that the moving elements will be moved at desired dissimilar proportions in the direction of the axes of said cylindrical grooved cams in consequence of the rotation of said cylindrical grooved cams and will be always separated with equal pitch.

* * * * *